United States Patent
Aswadhati

(10) Patent No.: US 9,009,391 B2
(45) Date of Patent: Apr. 14, 2015

(54) SOLID STATE DRIVE ARCHITECTURE

(75) Inventor: Ajoy Aswadhati, Cupertino, CA (US)

(73) Assignee: Fastor Systems, Inc., Santa Clara, CA (US)

( * ) Notice: Subject to any disclaimer, the term of this patent is extended or adjusted under 35 U.S.C. 154(b) by 733 days.

(21) Appl. No.: 13/280,206

(22) Filed: Oct. 24, 2011

(65) Prior Publication Data

US 2012/0102263 A1    Apr. 26, 2012

Related U.S. Application Data

(60) Provisional application No. 61/455,712, filed on Oct. 25, 2010.

(51) Int. Cl.
| | |
|---|---|
| *G06F 12/02* | (2006.01) |
| *G11C 16/00* | (2006.01) |
| *G06F 13/16* | (2006.01) |
| *G06F 13/28* | (2006.01) |
| *G06F 13/40* | (2006.01) |
| *G06F 3/06* | (2006.01) |

(52) U.S. Cl.
CPC ............... *G11C 16/00* (2013.01); *G06F 13/16* (2013.01); *G06F 13/28* (2013.01); *G06F 13/4022* (2013.01); *G06F 3/0616* (2013.01); *G06F 3/0658* (2013.01); *G06F 3/0688* (2013.01)

(58) Field of Classification Search
USPC .......................................................... 711/103
See application file for complete search history.

(56) References Cited

U.S. PATENT DOCUMENTS

| | | | |
|---|---|---|---|
| 6,587,894 B1 * | 7/2003 | Stracovsky et al. | 710/6 |
| 8,619,452 B2 * | 12/2013 | Rajan et al. | 365/51 |
| 2009/0150596 A1 * | 6/2009 | Cheng | 711/103 |
| 2010/0083040 A1 * | 4/2010 | Voigt et al. | 714/7 |
| 2010/0220643 A1 * | 9/2010 | Qi et al. | 370/312 |
| 2010/0250785 A1 * | 9/2010 | Shin et al. | 710/3 |
| 2012/0066435 A1 * | 3/2012 | Colgrove et al. | 711/103 |

* cited by examiner

*Primary Examiner* — Aracelis Ruiz
(74) *Attorney, Agent, or Firm* — Maryam Imam; IPxLaw Group LLP

(57) ABSTRACT

Embodiments of apparatuses, methods and systems of solid state drive are disclosed. One embodiment of a solid state drive includes a non-blocking fabric, wherein the non-blocking fabric comprises a plurality of ports, wherein a subset of the plurality of ports are each connected to a flash controller that is connected to at least one array of flash memory. Further, this embodiment includes a flash scheduler for scheduling data traffic through the non-blocking fabric, wherein the data traffic comprises a plurality of data packets, wherein the flash scheduler extracts flash fabric header information from each of the data packets and schedules the data traffic through the non-blocking fabric based on the extracted flash fabric header information. The scheduled data traffic provides transfer of data packets through the non-blocking fabric from at least one array of flash memory to at least one other array of flash memory.

60 Claims, 10 Drawing Sheets

Circular Buffer For Storing SSD Controller Status Logs

| Pointers | Index | Circular buffer data |
|---|---|---|
| Head Pointer -> | 1 | Unexpected power down at time: ttt |
| | 2 | Read flash page id: xxx, successful |
| | 3 | Write flash page id: yyy, successful |
| | | .... |
| | | ... |
| | i | Read flash page id:mmm, failure code: nnn |
| | i+1 | Write flash page id: yyx, successful |
| | | ... |
| | | ... |
| Tail Pointer -> | j | Read flash page id:mmm, failure code: nnn |
| | | ... |
| | | ... |

Figure 7

SOLID STATE DRIVE ARCHITECTURE

RELATED APPLICATIONS

This patent application claims priority to provisional patent application 61/455,712 filed on Oct. 25, 2010 and herein incorporated by reference.

BACKGROUND

1. Field of the Invention

The present disclosure relates generally to data storage systems, and more particularly to a solid state based storage system and methods of use and operation.

2. Description of Related Art

FIG. 1 shows a traditional architecture for Solid State Drives. It encompasses a front end host bus interface such as PCIe/Serial ATA(SATA)/Serial Attached SCSI(SAS) etc, coupled with the following elements: a micro-processor subsystem, host addressable register configuration space, a DRAM controller for caching data to and from the host. The DRAM controller interfaces to DRAM. All the elements connected to the controller will get their data eventually serialized when it has to move from one element to another using a store and forward scheme, utilizing the DRAM. NAND Flash controllers, DMA Engines to move data to and from the host to either DRAM or the Flash controller, and NAND Flash Memory.

Solid State Drives (SSDs) typically present themselves to an OS (operating system) such as Windows/Linux/Unix as a block storage device. Once the operating system recognizes the drive it communicates to the SSD through a driver provided by, for example, the SSD vendor or utilizing well known protocols such as Advanced Host Control Interface (AHCI). The host OS formats the drive into a contiguous Logical Block Address (LBA) space depending on the advertised capacity of the drive. LBA data transfer size is usually either 512 bytes or multiples of 512 bytes such as 1 Kbytes, 2 Kbytes or 4 Kbytes. Once the formatting is done the host OS creates a file system and stores data on the drive and retrieves it using the Logical Block Addressing mechanism. It primarily uses the following basic commands: LBA Write. A block of data equal to the LBA transfer size is sent along with the write command to be stored into non-volatile memory. LBA Read. A block of data equal to the LBA transfer size is read from non-volatile memory and transferred to the host. LBA Erase (Also known as TRIM command in Serial ATA protocol). This is a command only transfer from the host that tells the SSD that the block of data is no longer needed by the host.

A typical NAND flash architecture is shown in FIG. 2. FIG. 2 illustrates a single die and a NAND flash package can incorporate multiple such dies. A NAND die is essentially organized as multiple blocks and each block contains multiple pages. Pages can be written sequentially within a block and accessed randomly for reads. Pages cannot be overwritten without erasing an entire block containing those pages. Pages can be written only if a block has been erased earlier. To build a large capacity drive, a plurality of NAND devices is connected to a flash controller. The plurality of devices can be individually accessed by the flash controller.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 7 shows an example of a circular buffer for storing SSD controller status logic according to an embodiment.

DETAILED DESCRIPTION

Embodiments presented herein illustrate a flash-based Solid State Drive (SSD), SSD controller, and SSD controller hardware and software components. At least some embodiments of the hardware component and software component provide high throughput, scalability, reliability and availability in an SSD form factor. Some components of the overall SSD controller architecture can be implemented either in hardware (e.g., in an application specific integrated circuit (ASIC) or field programmable gate array (FPGA) technology or implemented in software. This permits a wide range of implementation choices based on desired cost and performance tradeoff.

Figure 3:
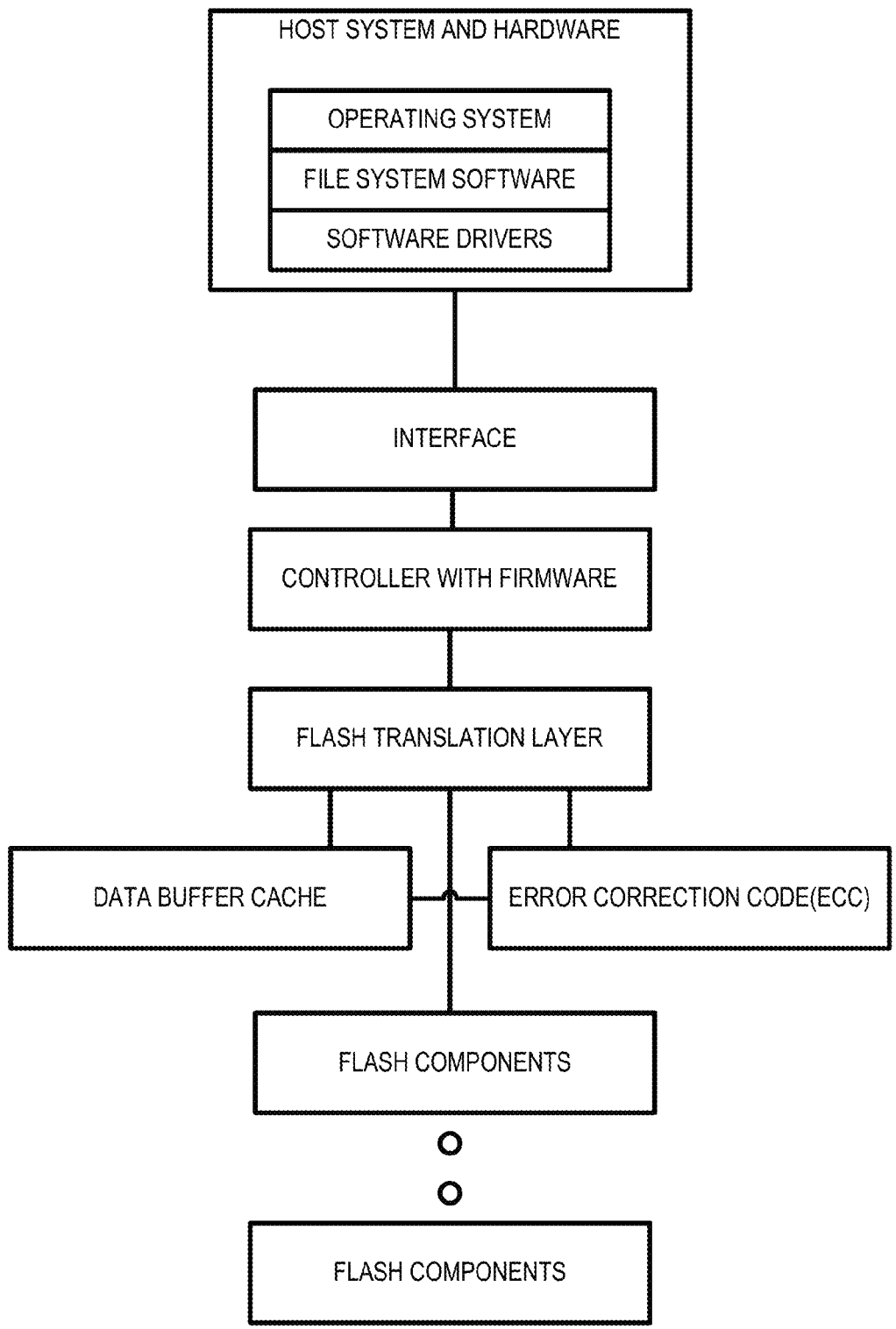
FIG. 3 shows a Software/Hardware SSD architecture.

Host communication with a typical SSD is shown in the FIG. 3 Software Hardware/Stack. To map the LBA's presented by the host to store/retrieve/erase data in the flash array, a flash translation layer (FTL) is provided by the flash controller. In addition to mapping host LBAs into Flash block and page addresses, at least some embodiments of the SSD provides the following capabilities in addition to normal house-keeping.

1. Wear leveling: Any LBA commands that are sent by the software drivers in the host will need be translated into an appropriate flash device/block/page.
2. Garbage Collection: Once a significant number of blocks of an SSD have been written, the SSD controller needs to return some of the blocks which have stale data to a fresh state by erasing that block.
3. ECC: As NAND flash writes/reads can have errors it is desirable to have an appropriate Error Detection and Coding (ECC) scheme to detect and correct errors.

The following terms are used throughout the description to refer to storage addressing/organizational concepts for one exemplary embodiment, although other embodiments can employ other storage architectures.

HOST: The CPU (central processing unit) subsystem to which SSD controller appears as a slave device.

eCPU (embedded CPU) or eHost: At least some embodiments of the SSD include an embedded processor (eCPU) inside the SSD controller. Embodiments include a single processor core with multi-threading capability or multiple-cores and combinations of these.

LUN (logical unit number): The LUN is the minimum unit that can independently execute commands and report status. There are one or more LUNs per target flash controller. A LUN typically maps to a single die in a package. Most high density flash devices include multiple dies per device package.

LBA (Logical Block Address): The LBA is an addressing mechanism typically used by hosts to address a block of data to write or read from storage medium. For example, hard disk drives or solid state drives use an LBA size of 512 bytes. In PCI-e based storage and xHCI based systems there is flexibility to increase the LBA size.

LBN (Logical Block Number): The eCPU or eHost treats the entire collection of flash arrays segmented as an array of blocks. The block size in bytes is same as the NAND flash block size. Each array will have specified number (LBN) of addressable blocks based on device configuration.

Figure 4A:
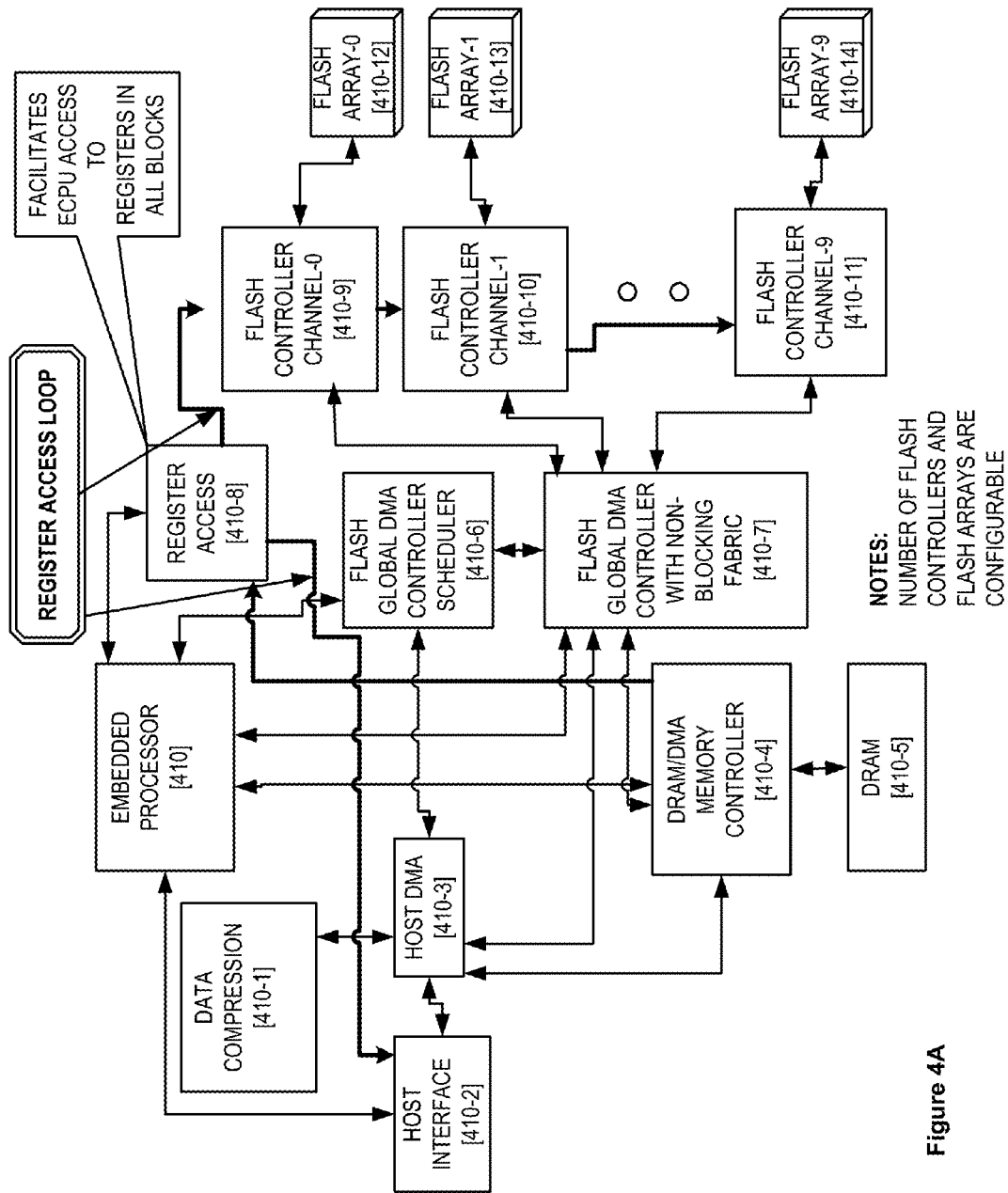
FIG. 4A contains a block diagram of an SSD according to an embodiment.

FIG. 4A illustrates the block diagram of one SSD embodiment capable of enabling a high performance system, according to embodiments. A brief description of each of the major components of this block diagram is explained in subsequent sections.

An Embedded Processor (eCPU) 410 acts as the central unit to receive and process commands from the host CPU. The eCPU 410 can include a plurality of such CPUs to support multiple threading or a single CPU that can support multithreaded programming.

A Host Interface 410-2 is a generic interface that is agnostic to various industry standard interfaces such as PCIe/USB/SATA/SAS etc. The Host Interface 410-2 isolates the internal functionality of the SSD controller from the specifics of the host channel, enabling the same fundamental core architecture to be targeted to any industry standard bus with relatively minor modifications.

A Host DMA Interface 410-3 enables transfers of data to and from the host interface.

A Flash Global DMA Controller with non-blocking fabric (referred to as non-blocking fabric in FIG. 4B) 410-7 moves data between the eCPU 410, the Host DMA Interface 410-2, a DRAM/DMA Memory Controller 410-4, and a plurality of Flash Controllers 410-9, 410-10, 410-11. A non-blocking switch fabric (within the Flash Global DMA Controller within Non-Blocking Fabric 410-7) permits concurrent data movement between modules listed (410, 410-2, 410-4, 410-9, 410-10, 410-11). This feature can provide significant advantages, in a given embodiment, as compared to prior art, serial-processed solid state disk designs. To further reduce latency, the non-blocking switch fabric can utilize a cut-through design, where data can be transported across the fabric even before the entire packet is ready at its ingress interface.

A Flash Global DMA Controller Scheduler (referred to as a flash scheduler in FIG. 4B) 410-6 handles all requests for data movement between the Flash Controllers 410-9, 410-10, 410-22), the DRAM Controller 410-4 (connected to volatile DRAM 410-5), eCPU 410, and the Host DMA Interface 410-2. The scheduler considers the priorities of various requests and grants access to the requesting entities based on the data movement within the fabric and the priority of the requests.

A Flash Translation Layer runs as a process on eCPU 410. The Flash Translation Layer maps LBAs to appropriate Flash controller array LUN/Block/Pages on the flash devices. The detailed signaling and mapping of the translated commands is done by the flash controller. For example, Address and Data need to be multiplexed on the same bus for accessing a flash device. This is done by the flash controller and beyond the scope of the Flash Translation Layer software. This partitioning also makes the design scalable and portable with minimal to practically no impact on the software. For targeting future nonvolatile memory devices the bulk of the architecture can be preserved by changing only the NAND specific part of the Flash Controller.

All the blocks in the SSD controller have internal registers that are accessible by the eCPU 410. A Register Access block provides a mechanism for the eCPU 410 to read and write to these registers. As shown in FIG. 4A, eCPU 410 uses the Register Access block for any access to registers in the controller. Each block has a specified address range that allows it to recognize register accesses to that block.

Each Flash Controller 410-9, 410-10, 410-11 talks directly to the flash devices in a Flash Array 410-12, 410-13, 410-14, with an ability to address every LUN individually in the array. In one embodiment, the Flash Controllers 410-9, 410-10, 410-11 can access an SLC array or an MLC array. The number of flash controllers 410-9, 410-10, 410-11 provided in the SSD depends on the capacity and performance needed.

A typical data flow to/from host is as follows. When a host issues an LBA read, the command is sent to the eCPU 410. The eCPU 410 first checks whether the requested data is in cache (e.g., saved in DRAM 410-5). When the requested data is in cache, then a DMA transfer of this data is initiated by the eCPU 410 to the host interface buffer. When the requested data is in flash, then the eCPU 410 sends a command to the correct flash controller to fetch the data to cache. The eCPU 410, DRAM controller 410-4, host interface 410-2, and other flash controllers 410-9, 410-10, 410-11 can continue to perform other tasks while the flash controller retrieves the data. Once data is moved to cache (cache not shown) by the flash controllers 410-9, 410-10, 410-11, the eCPU 410 gets a response to its earlier command, indicating that the data is available. The eCPU 410 then initiates a DMA transfer from cache to the host interface buffer. When a host issues an LBA write, the host interface sends the command to the eCPU 410 and sends the data to a write cache memory. When the flash translation layer decides to move the data from the write cache, the eHost sends a command to the appropriate flash controller to retrieve the data from the write cache and move the data to a flash location specified in the command.

FIG. 4A additionally shows data compression 410-1, a host DMA 410-3, and a register access 410-8.

Figure 4B:
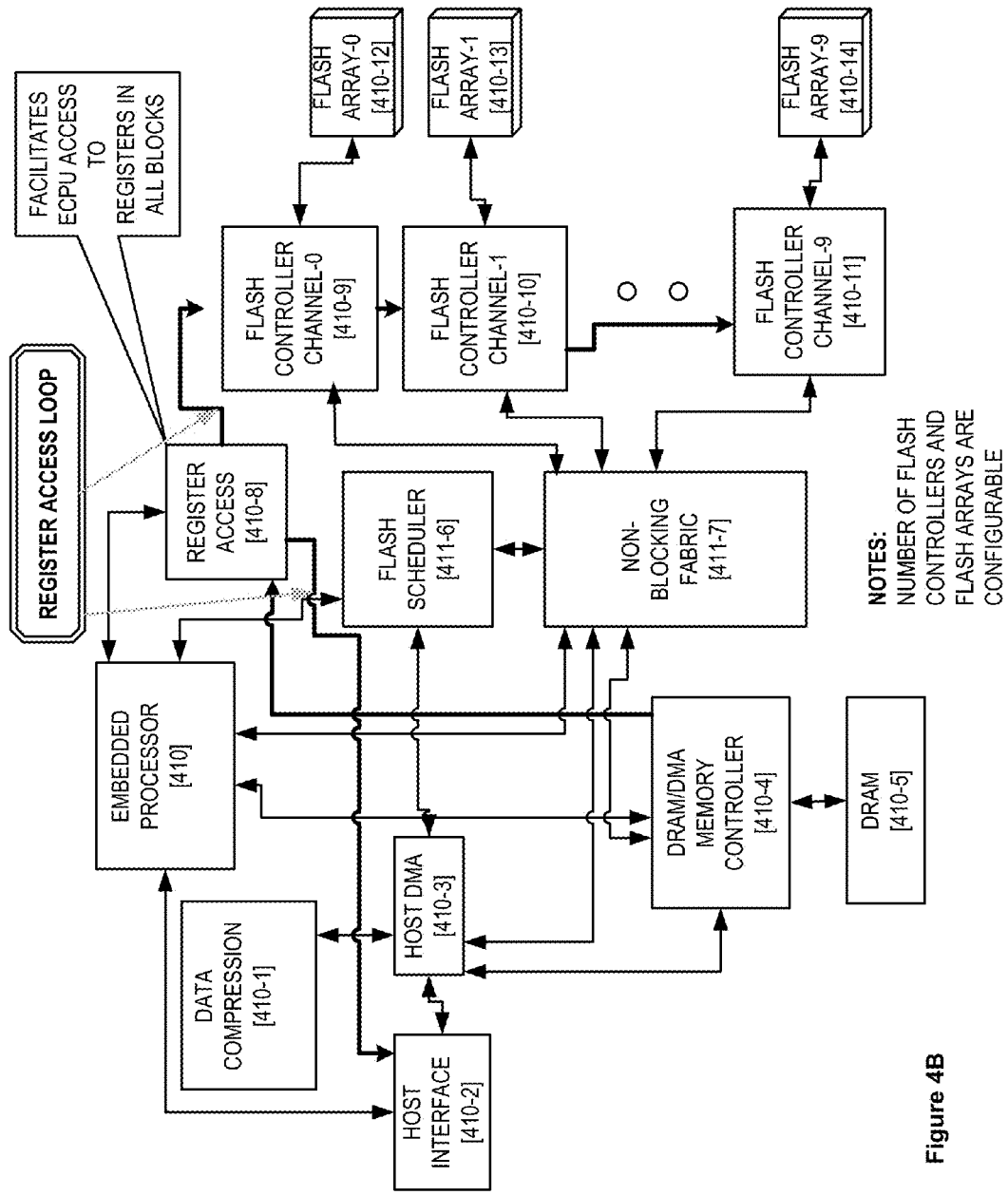
FIG. 4B contains a simpler block diagram of an SSD according to an embodiment.

FIG. 4B contains a simpler block diagram of an SSD according to an embodiment. For this the embodiment, the Flash Global DMA Controller Scheduler 410-6 is represented by a Flash Scheduler 411-6, and the Flash Global DMA Controller with Non-Block Fabric 410-7 is represented by a Non-Block Fabric 411-7. As shown, the SSD includes the non-blocking fabric 411-7, wherein the non-blocking fabric 411-7 includes a plurality of ports. As shown, a subset of the plurality of ports are each connected to a flash controller 410-9, 410-10, 410-11 that is connected to at least one array of flash memory 410-12, 410-13, 410-14. Further, the flash scheduler 411-6 schedules data traffic through the non-blocking fabric 411-7.

The flash scheduler (411-6, FIG. 4D) reads the flash fabric headers that are presented to the non-blocking fabric (411-7, 4D0-1 to 4D0-N). The flash scheduler 411-6 extracts the relevant information that is critical to the data movement between the various ports of the non-blocking fabric 411-7 that is expected to pass through the non-blocking fabric 411-7. Examples of the data used in decision making are the Destination id, Priority and external events such as Power Down. Based on the required usage model for the SSD, various scheduling algorithms can be implemented in arriving at a final decision of which input ports can be connected to which output ports of the Non-blocking fabric 411-6. This connectivity decision is sent via the Fabric Interface (411-7, 4D1-11).

Figure 1:
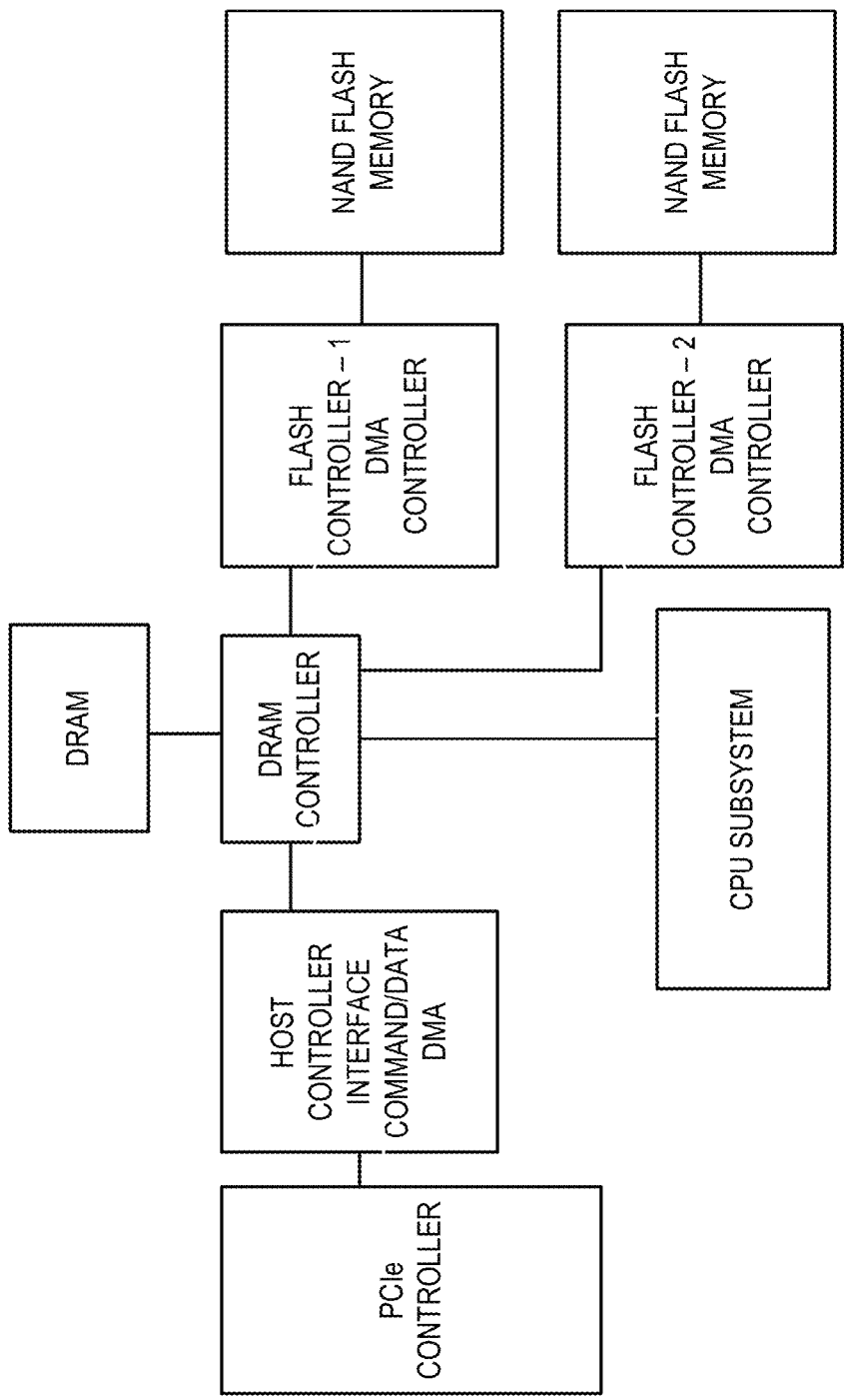
FIG. 1 illustrates a prior art solid state drive
Figure 2:
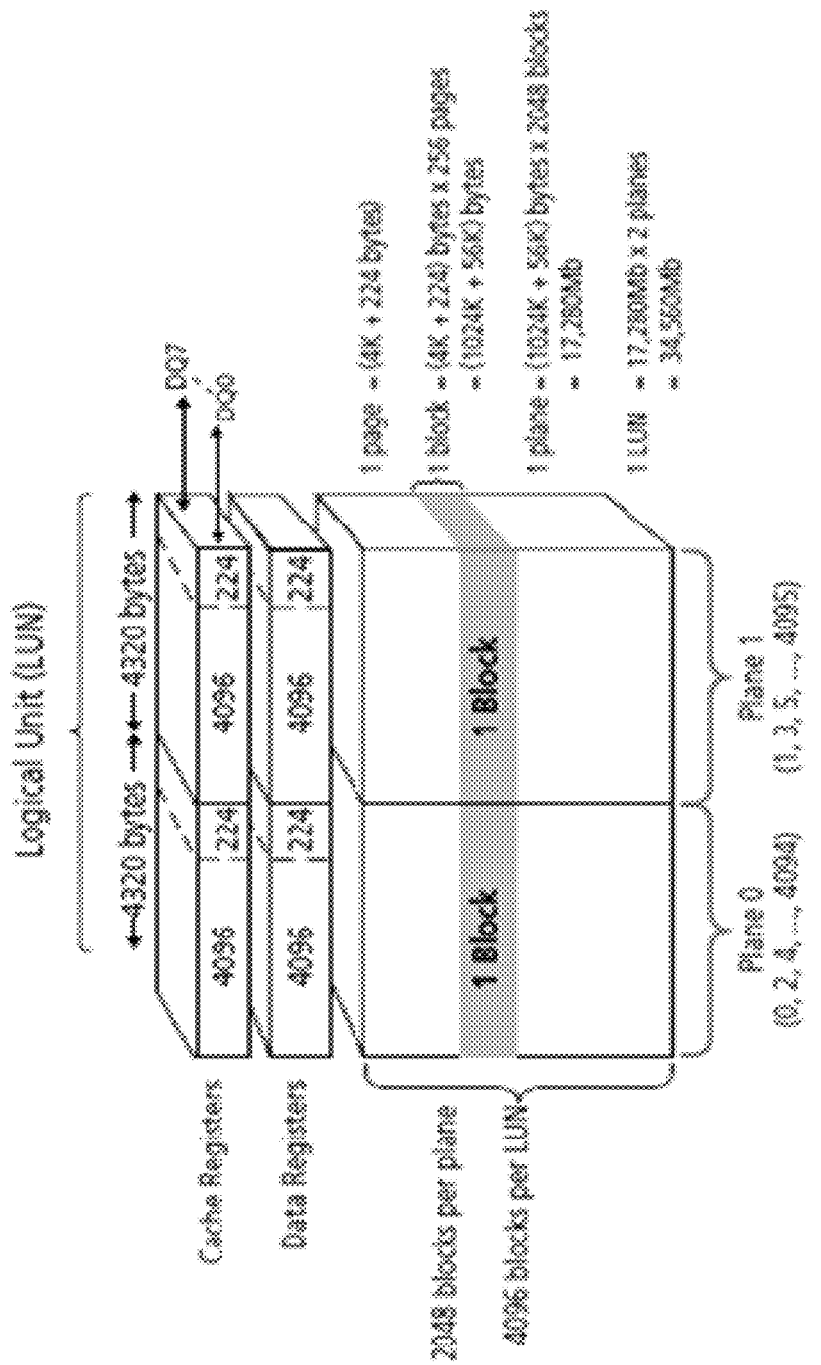
FIG. 2 illustrates an exemplary NAND flash device/block/page architecture

The data traffic includes a plurality of data packets. The flash scheduler 411-6 extracts flash fabric header information from each of the data packets and schedules the data traffic through the non-blocking fabric (411-7 in FIG. 4B, 4C1-1 in FIG. 4C) based on the extracted flash fabric header information. As previously described, the scheduled data traffic provides transfer of data packets through the non-blocking fabric 411-7 from at least one array of flash memory 410-12, 410-13, 410-14 to at least one other array of flash memory 410-12, 410-13, 410-14.

At least some embodiments of the flash scheduler 411-6 extract priority information of each data packet from the flash fabric header information of the data packet, and wherein the flash scheduler 411-6 schedules high priority data packets before low priority packets, enabling data packet movement through the non-blocking fabric 411-7. The priority scheduling is enabled through the use of plurality of queues in cache (not shown). At least some embodiments of the enabled data packet movement include at least one of reading and writing data packets from or to arrays of flash memory. Further, at least some embodiments of the enabled data packet movement includes at least one of reading and writing data packets from or to arrays of flash memory, and at least one of receiving and providing data packets to at least one of an embedded central processing unit (eCPU) and volatile memory.

For at least some embodiments, the priority information of each of the data packet is influenced by events external to the flash scheduler. One example of an external event includes a power failure. For this example, writes are elevated in priority—which can include preempting higher priority reads.

For at least some embodiments, if a scheduled data packet fails, then the flash scheduler provides an indication of the failure to an eCPU connected to a port of the non-blocking fabric. This indication of failure beneficially allows the eCPU to eliminate polling. Eliminating polling in the controller, frees up the eCPU to perform other cycles such as monitoring the health of the SSD, reducing latency to incoming requests from the Host system. Examples of failure of a scheduled packet can be, a flash page write not completing successfully, corrupted data read from a flash page and other such errors that occur when interfacing to flash devices.

As will be described, embodiments of the flash fabric header information of the data packets include commands associated with the data packets. For example, one embodiment of the flash fabric header information includes a write cancel operation bit that directs the flash scheduler to cancel a write of the data packet to an array of flash memory, through the use of a bypass queue. Another embodiment of the flash fabric header information includes a write immediate operation bit that directs the flash scheduler to increase the priority of the data packet. Another embodiment of the flash fabric header information includes a multiple queues operation bit that directs the flash scheduler to put the data packet in multiple queues. Another embodiment of the flash fabric header information includes a no retry operation bit that directs the flash scheduler to avoid retries of operations of the data packet read from flash devices. Another embodiment of the flash fabric header information includes stacked header information, wherein the flash schedule performs multiple operations based on the stacked header information, autonomous from an embedded central processing unit (eCPU) connected to the first port of the non-blocking fabric.

Additionally, embodiments of the SSD include a data scrambler, and a data pattern compression engine, wherein the data pattern compression engine parses data packets, recognizing patterns and compresses the data packets based on the recognized patterns. As will be described, other embodiments of the SSD include a circular buffer for tracking alerts and errors of operation of the flash scheduler (FIG. 7).

Embodiments of operation the SSD of FIG. 4A or 4B provide a method of controlling data packets of arrays of flash memory. The method includes extracting, by a flash scheduler, flash fabric header information from each data packet of a data traffic, wherein the data traffic comprises of a plurality of data packets. Further, the method includes scheduling, by the flash scheduler, the data traffic through a non-blocking fabric of a solid state drive based on the extracted flash fabric header information, wherein the non-blocking fabric comprises a plurality of ports, and wherein a subset of the plurality of ports are each connected to a flash controller that is connected to at least one array of flash memory, and wherein at least one of the plurality of the ports of the non-blocking fabric comprises electrical connections to at least an embedded central processing unit (eCPU). The scheduled data traffic provides transfer of data packets through the non-blocking fabric from at least one array of flash memory to at least one other array of flash memory based on the flash header information.

Figure 4C:
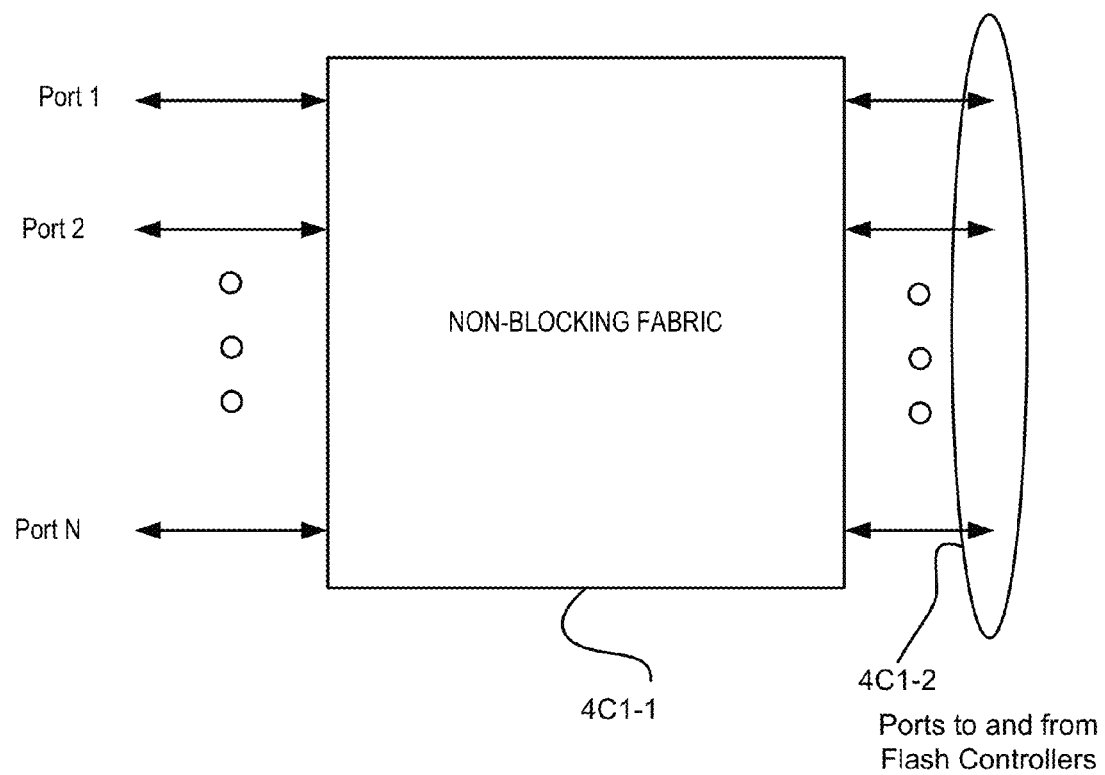
FIG. 4C shows an embodiment of a non-blocking fabric.

FIG. 4C shows an embodiment of a non-blocking fabric 4C1-1. For at least some embodiments, the non-blocking fabric 4C1-1 is a device that can connect N inputs (such as Port 1 to Port N) to N outputs (such as outputs 4C1-2) in any combination. It has the property of being able to connect N inputs to N outputs in any one-to-one combination. It is to be understood that the inputs and outputs of the non-blocking fabric 4C1-1 are bi-directional ports. As shown, as least one of the ports 4C1-2 include electrical connections the flash controllers, and at least one port is electrically connected to at least an embedded central processing unit (eCPU).

Figure 4D:
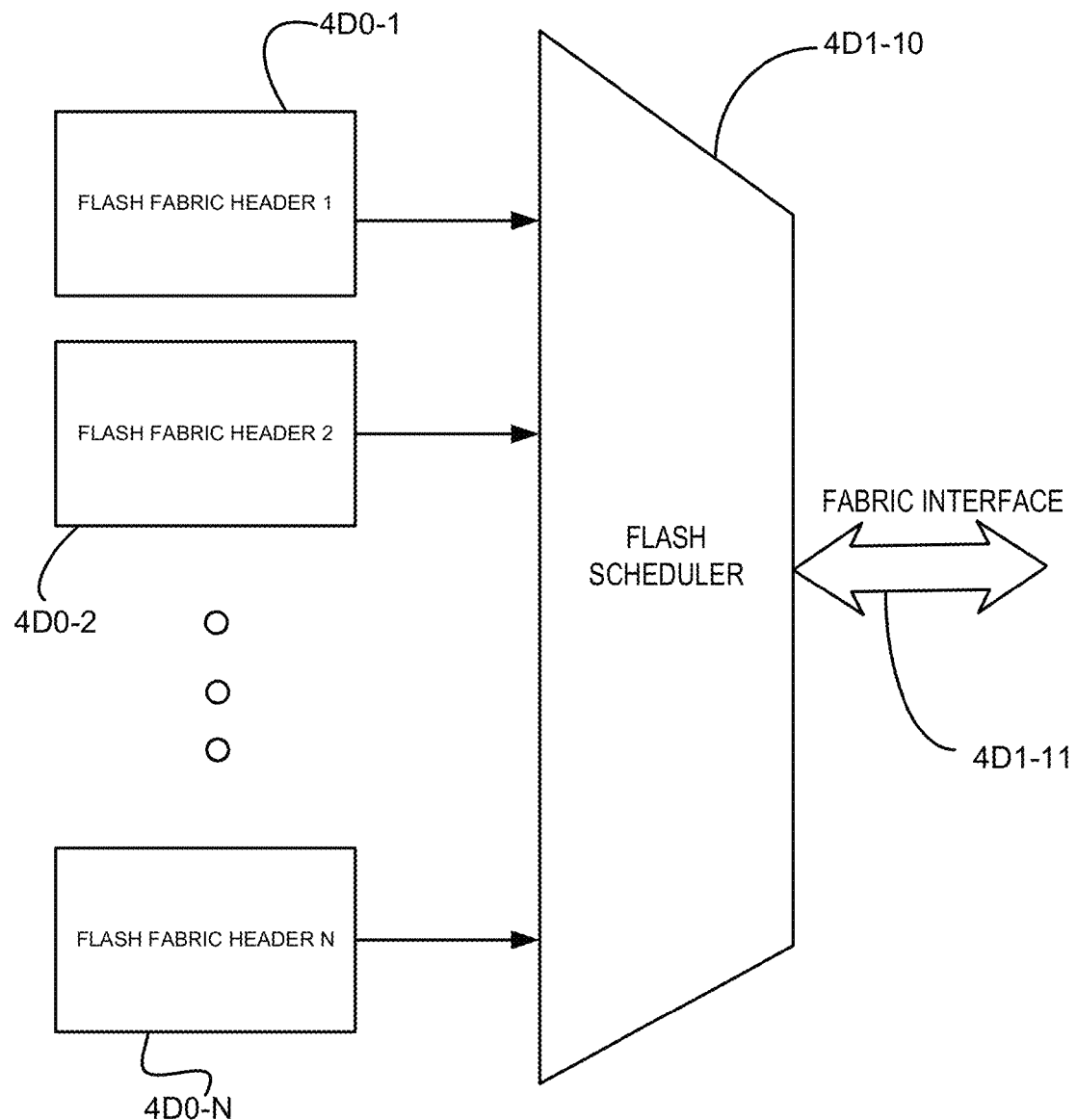
FIG. 4D shows an embodiment of a flash scheduler.

FIG. 4D shows an embodiment of a flash scheduler 4D1-10. The flash scheduler 4D1-10 receives data packets an extracts flash fabric header information from flash fabric headers 4D0-1, 4D0-2, 4D0-N. The flash scheduler 4D1-10 is interfaced (4D1-11) with the non-blocking fabric and controls the operation of the non-blocking fabric per the commands included within the flash fabric header information.

Figure 5:
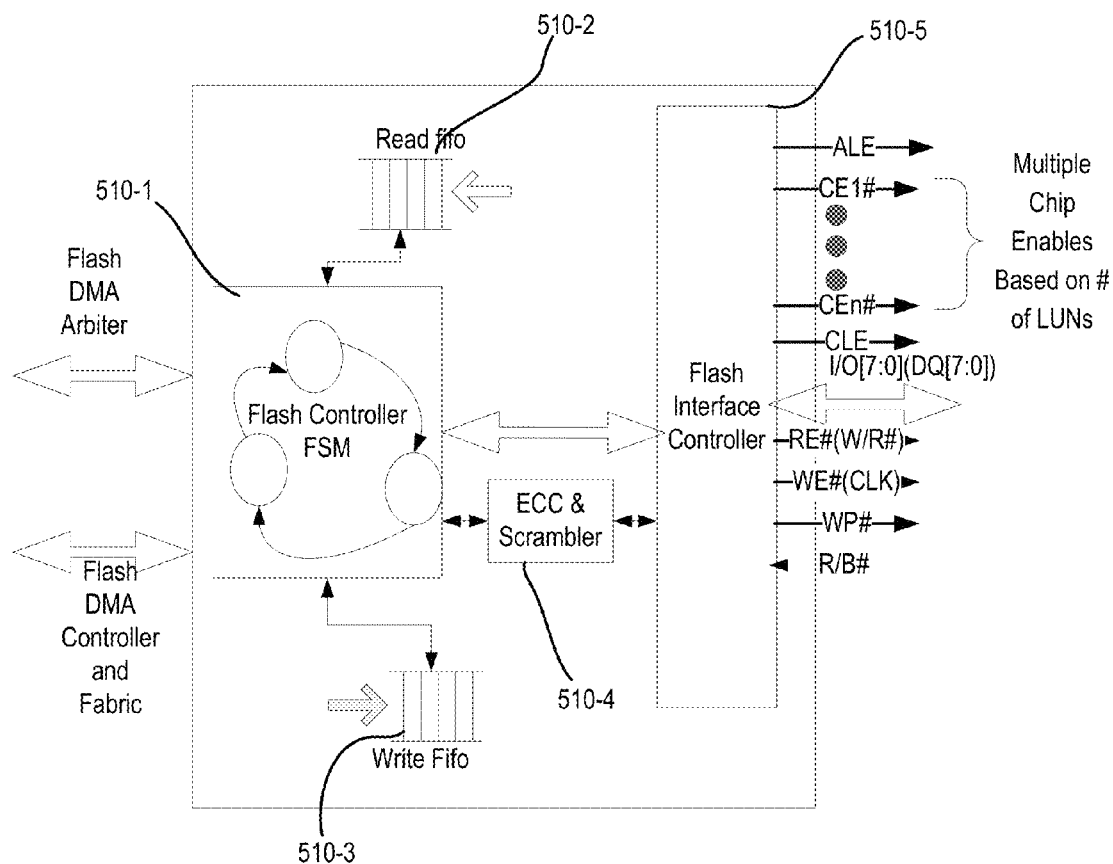
FIG. 5 contains a block diagram of a flash controller useful in some embodiments.

FIG. 5 shows a block diagram for one embodiment of a NAND flash controller. A flash controller write FIFO 510-3 accepts commands from the eCPU to e.g., erase a specified block in LUN(n), program a page in LUN(n) with attached write data, read a page of data from LUN(n), or read a specified status register in LUN(n). The write FIFO 510-3 can include multiple FIFO constructs, with different priorities for each FIFO, different FIFOs for each command type, and/or different FIFOs for each LUN.

A flash controller Finite State Machine (FSM) 510-1 reads the command headers in the write queue and controls an ECC (Error Correction Coding) and scrambler 510-4 and a flash interface controller 510-5 to move write data from the write FIFO 510-3 to the correct LUN, move read data from the correct LUN to the read FIFO 510-2, perform integrity checks and read retries, attach headers to results placed in the read FIFO 510-2, and request movement of data from the read FIFO 510-2 to the proper fabric destination. The read FIFO 510-2 can include multiple FIFO constructs, with different priorities for each FIFO, different FIFOs for each command response type, and/or different FIFOs for each response from LUN.

The ECC and Scrambler block 510-4 performs error correction and detection, with the scrambler improving the randomness of data written to flash. This block is preferably instantiated as part of each Flash Controller, as shown in FIG. 5. Alternately, ECC and/or scrambling can be a centralized resource shared between multiple Flash Controllers, based on cost and performance required by the SSD.

As previously described, the Non-blocking Fabric switches data and command packets internally between the attached SSD controller blocks. Each packet contains a Flash Fabric Header (FFH) that describes its contents, destination, tasks performed or to be performed, status, etc. When the host interacts with the SSD controller for data exchange, the fundamental operations are an LBA Write data, LBA Read request and LBA delete. The eCPU on the SSD controller examines these requests and creates a Flash Fabric Header (FFH), e.g. with the following structure in one embodiment. In other embodiments, field definition and size can be extended to add more distributed functionality and scalability. The bit locations and fields are for one exemplary implementation, and could change during implementation for optimal use. The header definition contained in Table 1 does, however, show various features of an exemplary embodiment of a header, and their manner of implementation through header use.

TABLE 1

| Name | Bit(s) | Default Value | Description |
|---|---|---|---|
| Fabric Header(FFH) Version | 3:0 | 0x1 | Version of Flash Fabric Header(FFH). Current version is 0x1 |
| LBA number | 27:4 | | The LBA number specified by the host to write/read/delete. This will be extracted from the host request and copied into the Flash Fabric Header(FFH). With this version there is provision for 8 million unique LBAs |
| Destination ID | 31:28 | | The values in this field are used by the switch fabric and global scheduler to send the Flash Fabric Header + Optional payload (Packet) to the appropriate destination. Each of the blocks that will receive and transmit a Flash Fabric packet is assigned a unique ID. The following ids are assigned.<br>Destination ID  Target<br><br>0x1            eCPU<br>0x2            Memory Controller<br>0x3            Host DMA<br>0x4            Flash Controller 1<br>0x5            Flash Controller 2<br>0x6            Flash Controller 3<br>0x7            Flash Controller 4 and so on until 'n' number of flash controllers are addressed. |
| LBA size | 40:32 | 0x4 | The size of LBA encoded as below. This represents the payload size for writes and requested payload data from flash for reads.<br>Size of LBA based on field value:<br>0x1 => 512 bytes (Used by SATA type drives)<br>0x2 => 1K bytes<br>0x3 => 2K bytes<br>0x4 => 4K bytes<br>0x5 => 8K bytes<br>It is possible that the LBA size can be smaller or greater than the page granularity of NAND flash. For the case of LBA size < Nand flash page size, multiple LBAs are mapped to one NAND page. For the case of LBA size > Nand flash page size, multiple flash pages are mapped to the LBA. It is the responsibility of the eHost to manage this size mismatch. The flash controller expects a page of data to be written at one time.. |
| Flash controller number | 45:41 | | Specifies the flash controller of the flash array. Used by the Switch fabric and the scheduler to route Flash Fabric Header + Optional payload to the targeted flash controller. |
| LUN Number | 48:41 | | Address of LUN number for specified Flash controller. Provision for addressing 256 LUNs per Flash controller. |
| Block Number | 61:49 | | Address of Block number within specified LUN of a flash controller. Provision for addressing up to 8K blocks within a LUN. |
| Plane Number | 63:62 | | Address of plane within a LUN. Current generation devices have only 2 planes. Support for 4 plane addressing. |
| Page Number | 73:64 | | Starting page number to access read data or write data. |
| Command | 77:74 | | Command intended for the recipient. eHost can specify an LBA to be read, which is typically smaller than the page size. The flash controller will provide only the relevant data in the case of an LBA read and discard the rest of the page data.<br>Following are defined for now:<br>0x0 => Read LBA<br>0x1 => Read Page<br>0x2 => Write LBA<br>0x3 => Erase specified 'Block' using 'Block Number'<br>Note: This field is important for any target that is a recipient and needs to be decoded quickly. In high-performance embodiments this field can occupy bits near the top of the table. |

TABLE 1-continued

| Name | Bit(s) | Default Value | Description |
|---|---|---|---|
| Nand Command Set | 85:78 | | These are the command sets available in a typical NAND device. Some example commands are:<br>Reset<br>Synchronous Reset<br>Read ID<br>Read Parameter Page<br>Get Features<br>Set Features<br>Read Status<br>Read Mode<br>Read Page<br>A complete list of commands for NAND flash would be specific to the appropriate implementation. Some of these NAND flash commands can be set by the eHost on power-on or to do housekeeping such as tracking bad blocks and enabling special capabilities that are available in the device family. |
| Status | 89:86 | | Status of command completion:<br>0x1 => Write successful<br>0x2 => Write error<br>0x3 => Read successful<br>0x4 => Read error<br>0x5 => Erase successful<br>0x6 => Erase Error |
| Command Retry | 94:90 | | Number of times to retry the command such as Read data from flash in case of errors encountered, without eCPU intervention. |
| Priority | 98:95 | | Values in this field indicate the priority that is needed for servicing the packet either by the scheduler or by the eCPU |
| Write Cancel | 99 | | If set to '1' this indicates that an earlier write in the queue of the flash controller needs to be cancelled. This bit is set in conjunction with the Priority field to be the highest. Highest priority commands will bypass the regular queue in the Flash controller. |
| Write Immediate | 100 | | If set to '1' along with Priority bits set to highest value, it will send the command to the bypass FIFO in the flash controller for immediate write to flash. |
| NO Retry | 101 | | If this bit is set, the flash controller should not attempt to retry a request, such as an LBA read that failed. |
| Next Header | 102 | | If set to '1' it indicates that there is an additional header beneath this for processing by the target destination device |
| Reserved | 104:103 | | Reserved for future use |

One feature that can be implemented efficiently with the header mechanism is mirroring, otherwise known as RAID 1 (RAID is an acronym for Redundant Array of Independent Disks). Use of the header mechanism facilitates replication of data without eCPU intervention. This is useful for RAID implementations where a physical copy of the data is stored in a different area, e.g., stored on flash devices served by two different flash controllers. The Next Header bit can indicate that there is an additional Flash Fabric Header attached contiguous to the first header. This second header can specify the second destination for this data. The switch fabric, in conjunction with the scheduler, can duplicate the data to be mirrored along with appropriate header changes, so that data is simultaneously and independently stored into different destinations. Without this mechanism, the CPU needs to make physical copies, which is compute intensive and requires potentially twice the compute time to support RAID.

A Flash Fabric Header is created by the eHost for every request originated by the Host. This header is then prepended optionally to the payload (for the case of LBA Writes). This process creates the Flash Fabric packet Packet. Once a packet is created and ready for transmission to its destination, the eHost sends the Flash Fabric Header to the Global Scheduler. The Global Scheduler receives all such requests from multiple sources and schedules traffic to be switched through the non-blocking fabric, based on fabric availability, the priority encoded in the packet, and other criteria. There is flexibility in accommodating various efficient scheduling algorithms. Further to provide optimal flexibility and configurability, the Global Scheduler can be implemented in software either as an independent thread, or assigned to a dedicated CPU core.

In the architecture described below, only the data that needs to be processed by the eCPU will be sent to the eCPU, and the payload will be kept in buffers until the necessary action is taken. This saves CPU cycles in not having to move and copy payload data that is not useful in decision making.

For LBA Writes, the Flash Fabric Packet is illustrated below.

| Flash Fabric Header (Write command) |
|---|
| LBA Write data |

Upon reception of this packet by the flash controller, the flash controller will attempt to complete the write to the specified LUN/Plane/Block/Page location, and place the packet write status in the status field of a response Flash Fabric Header. Note that the flash controller will only update the relevant fields of the Flash Fabric Header, in this case 'status' and 'direction'. The flash controller then returns the response packet through the fabric to the eHost for appropriate action. The eHost examines the response Flash Fabric Header. If the write terminated unsuccessfully, the eHost will attempt to retry the write to a different location. Upon successful write, the eHost also updates the metadata, which holds LBA to Flash translation information.

---
Flash Fabric Header(Write status)
---

If the write fails the failed status is sent to the eHOST. The eHOST maintains the write data in a cache until it sees a successful write response. If the eHOST receives a failed write status, it updates the Flash Fabric Header with a new write destination and schedules it for transmission to the new destination.

For LBA Reads the Flash Fabric Packet will appear as:

---
Flash Fabric Header(Read Command)
---

This packet is sent to the fabric for routing to the appropriate flash controller. On reception of this packet the flash controller will fulfill the Read request and send back the following packet to the fabric:

---
Flash Fabric Header (Read complete)
LBA Read data(from Flash)
---

This data can be either sent to DRAM for buffering in anticipation of wear leveling and garbage collection or sent to the host interface. On completion the status indicated in the header is sent to the eHost and the data is saved in cache (on chip or DRAM). The eHost can initiate a DMA of this data from cache to Host if it was requested earlier.

In case of a Read failure the following packet would be sent back.

---
Flash Fabric Header (Read failed)
---

Similarly, the Flash Fabric packet appears as follows for Block Erase requests:

---
Flash Fabric Header (Block Erase)
---

The flash controller will send back the success or failure of the Block Erase in the following format updating the status field.

---
Flash Fabric Header (Block Erase Status)
---

The flash controller processes every packet it receives via the fabric and follows the commands embedded in the Flash Fabric header. In all cases it will send back the original header with status updated to the fabric and with optional payload (for reads) to the eHost to indicate command completion. The eHost takes further action based on the status of command completion.

The use of Flash Fabric headers permits a highly efficient and scalable distributed processing. The eCPU can avoid issuing single commands and wasting precious cycles to wait for their completion, either by polling or waiting for an interrupt from a flash controller. This architecture permits all the completed commands from Flash controller/DRAM controllers to send back the status to the eHost autonomously without eCPU intervention. This in turn permits queuing up of all the completed commands to the eHost so it can decide to process these completed commands based on its current load and threshold of these completed command queues.

In some embodiments, the eCPU has separate queues to handle these response packets, based on priority. All queues can be classified based on type as well, such as Read response queues, Write response queues, and Block Erase response queues. Read response queues can, for instance, have higher priority than other queues. The priority fields in the Flash Fabric header can be utilized for this purpose and for scheduling data through the fabric. For instance, in the event of a power failure, the metadata in DRAM can be scheduled to be flushed into non-volatile storage ahead of the data that can be recovered such as Read data in cache. The Global Scheduler can steer traffic to these queues without any eCPU intervention after examining the priority and the type of response packet.

The eCPU does not need to poll for a successful completion of any command and waste cycles. If the Flash Controller terminates a transaction, either successfully or unsuccessfully, it sends the response packet to the eCPU so it can take the appropriate action. For instance, if a write to the specified destination Flash controller/Device/Block/Page was not successful, the response packet will come back with an error in the Flash Fabric header as well as the write LBA data. This will permit the eCPU to schedule the write to a different destination by merely changing the destination field in the header. It does not need to allocate the write data from the prior write command as it is still part of the Flash Fabric packet.

Some features that can be enabled by this architecture are listed below.

WRITE CANCEL: If an operating system decides to write to the same LBA that was sent earlier to the SSD, it is implied that the write data associated with the prior LBA write needs to be discarded. Using the Flash Fabric header bit 'WRITE CANCEL' it is possible to cancel a prior LBA write to a destination flash controller in tandem with setting a higher priority that ends in a bypass queue of the flash controller. This will save a write to the flash page. It is conceivable that it can greatly improve the endurance of the SSD as un-necessary writes to flash are prevented in a just in time fashion.

WRITE-IMMEDIATE: In the event of an impending power outage, or other critical events where the OS needs to flush its data to Flash, this bit in the Flash Fabric header can be set and sent to the flash controller along with priority bits set to highest level. This will be queued in the bypass FIFO of the flash controller and given priority over other lower non-critical commands such as read LBA.

MULTIPLE QUEUES: The use of the priority field can enable commands to and from the flash controller to be queued in different queues. This enables higher priority commands to get ahead and lower priority commands to be scheduled later. For example a mirror packet for RAID purposes can have a lower priority than the original copy or other critical traffic.

NO RETRY: It is important to read data from flash that has not been used for a long time to verify the integrity of the data in flash. The eCPU can have a background task to read all the valid pages in the flash array by setting this bit. When the flash controller sees this bit in the Flash Fabric header, it will not attempt a retry of the specified commands (such as an LBA read), but the flash controller will inform eCPU of the success and failure of the command through a response packet. This will enable the software on the eCPU to derive failure patterns and construct the health of the flash array for further action.

AUTONOMOUS DATA MOVEMENT: The eCPU, or any block in the SSD controller, can stack two Flash Fabric headers using the Next Header bit. This can enable autonomous data movement without CPU intervention. For example, if a page of data needs to be moved from a specific block to another block due to garbage collection or any other request, the eHost can create a stacked Flash Fabric header. The first header has the instructions for reading from a specified page/block, and the second stacked header has the second destination page/block. This is interpreted by the Flash controller to move data accordingly using the fabric and global scheduler, and if the move is within the range of the original Flash controller, it will do it internally. At the end of the transaction the receiving flash controller can indicate the completion status via the response header to the eCPU for further action. This will greatly eliminate CPU cycles in moving data from one page/block to another page/block.

MULTIPLE PROFILES: Since storage applications offer different workloads, the SSD controller can offer different profiles that will load appropriate firmware/register settings based on an API or graphical user interface. For example, it might be desirable for some workloads to throttle LBA writes to improve endurance at the expense of performance. This can be accomplished by setting appropriate registers in the controller, and throttle the LBA writes based on the requested settings. Variations of this can be used for other mechanisms such as prioritizing reads over writes, providing peak write performance at the cost of endurance, etc.

WRITE AMPLIFICATION METER: Due to the limitations of flash endurance (ability to write a block for a specified number of times after which it reaches end of life), it is important to keep track of actual amount of data that is written to flash. A simple write amplification formula is specified as follows:

$$\frac{\text{Data written to flash memory}}{\text{Data written by the host}} = \text{Write amplification}$$

There are other variations of the above mentioned formula. The SSD controller provides logic to implement this and other formula variations, to be used for warranty tracking. Due to the varying work loads of different applications, the endurance or lifetime of current day SSDs are specified in terms of amount of data written to the drive. By keeping track of this statistic and the write amplification, the SSD manufacturer has a chance to prove or disprove a customer claim if the drive failed within the warranty window. This is also useful for failure analysis.

DATA SCRAMBLER: The SSD controller will scramble the data written to the drive, and the ECC is computed on top of the scrambled data. Scrambling is valuable when data patterns are regular, which in turn can cause read disturb errors from flash arrays.

REGULAR PATTERN DATA COMPRESSION: The SSD controller can optionally [410-1] include a front end engine, which parses incoming data patterns to do on-the-fly compression. It identifies whether an LBA data block that is to be written can be expressed as a repeatable pattern such as all '1', all 0's and other such examples. For LBAs with such patterns, the SSD does not copy the entire LBA data into a corresponding flash block/page. Instead, it coalesces multiples of these patterns with their corresponding LBA numbers into a specific block/page along with the appropriate metadata to extract them.

EVENT CORRELATION OF SSD HEALTH/STATUS: The SSD controller can include a circular buffer that is used for tracking various alerts/errors that occur during operation of the controller. Examples of these alerts are too many read errors or block erase errors in a specific LUN or device. The SSD controller does a correlation of these events and coalesces these multiple events into one event with a count associated with that event. This helps maximize the use of valuable memory space in these tightly constrained embedded systems. Without this mechanism, a single recurring bad event can fill up the entire buffer allocated for keeping these status logs. The recurring bad event, if every occurrence is saved separately, could prevent visibility of other potentially more critical errors.

Figure 6:
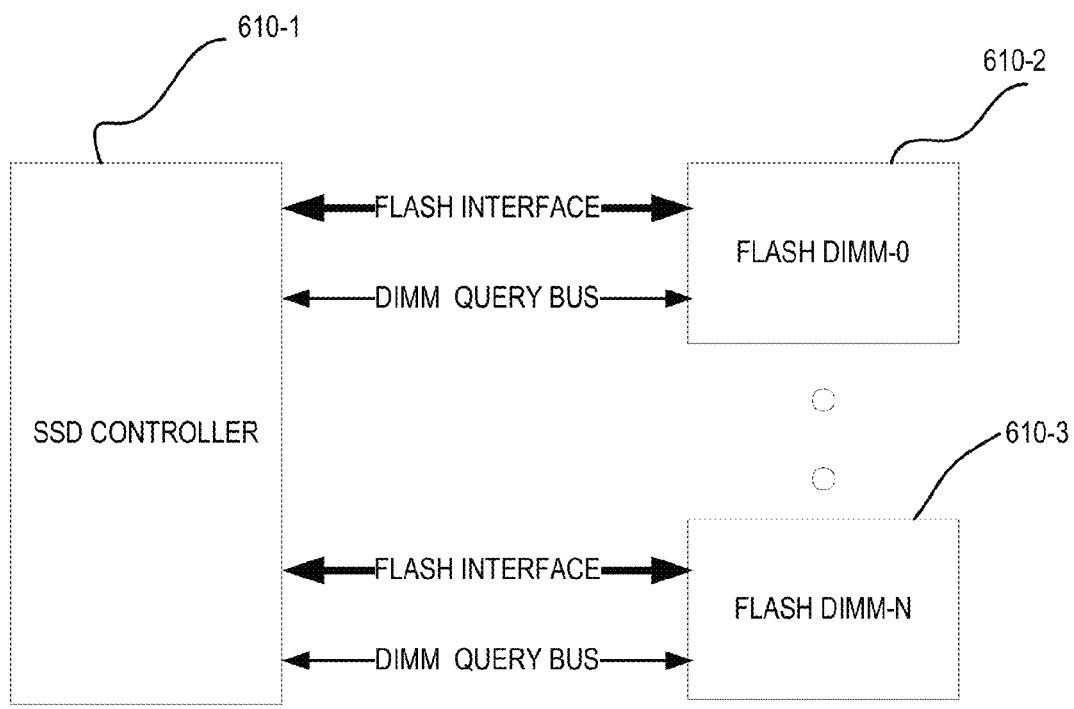
FIG. 6 contains a block diagram for a SSD according to an embodiment having a controller communicating with multiple Flash DIMMs.

AUTOMATIC FLASH DIMM RECOGNITION AND CONFIGURATION: FIG. 6 shows an embodiment of an SSD where the controller configures the Flash Controller [410-11] automatically after querying the type and manufacturer of the Flash. Currently there is no single unifying standard for Flash from different manufacturers. A flash array 610-2, 610-3 can be constructed similar to memory DIMMs that are pluggable into a computer subsystem. The SSD controller 610-1 can query the DIMM configuration using an interface such as I2C. Based on this information it can auto-configure the Flash Controller to communicate with the flash array in the Flash DIMM without manual intervention.

Designing a unified flash controller for supporting multiple manufacturers is more expensive, as opposed to a device that supports only a specific manufacturer and device family. An attractive compromise can be further refined if the SSD controller 610-1 is implemented in an FPGA. An FPGA bit file that matches the profile of the attached Flash DIMM can be downloaded into the FPGA. This has the added benefit of supporting multiple manufacturers/device families while having a controller that is hardware-programmed specific to the flash array, potentially reducing the size of the FPGA device and leading to lower cost.

The eHost is responsible for mapping LBAs to appropriate Flash controller array LUN/Block/Pages of a flash device. In one embodiment, software is responsible for this translation. The detailed signaling and mapping of the translated commands is later done by the flash controller. This partitioning also makes the design scalable and portable with minimal to practically no impact on the software. For targeting future flash devices, a designer simply needs to change the stages in the flash controller that interface to the raw NAND flash device.

Every transaction that arrives on the host interface is passed to a Host Interface thread running on the eCPU. Some examples of transactions that arrive include Write an LBA, Read a specified LBA, Erase a specified LBA and query status of the flash controller, capabilities of the flash controller, etc.

FIG. 7 shows an example of a circular buffer for storing SSD controller status logic according to an embodiment. The circular buffer is employed to store the last N number of critical or important informational messages that are useful for determining the health and longevity of the SSD. The messages logged could comprise a read and write errors to the flash array, extreme operating environment, such as high temperature that could degrade the life of the SSD. The use of a circular buffer helps in keeping an upper bound on the amount of messages that are critical and also retain the information from the recent past. These messages need to be further stored into a suitable location in the flash array.

What is claimed is:

1. A solid state drive, comprising:
a non-blocking fabric, wherein the non-blocking fabric comprises a plurality of ports, wherein a subset of the plurality of ports are each connected to a flash controller that is connected to at least one array of flash memory; and
a flash scheduler for scheduling data traffic through the non-blocking fabric, wherein the data traffic comprises a plurality of data packets, wherein the flash scheduler extracts flash fabric header information from each of the data packets and schedules the data traffic through the non-blocking fabric based on the extracted flash fabric header information, the flash fabric header information including a write cancel operation bit that directs the flash scheduler to cancel a write of the data packet to an array of flash memory using a bypass queue;
wherein the scheduled data traffic provides transfer of data packets through the non-blocking fabric from at least one array of flash memory to at least one other array of flash memory.

2. The solid state drive of claim 1, further comprising the flash scheduler extracting priority information of each data packet from the flash fabric header information of the data packet, and wherein the flash scheduler schedules high priority data packets before low priority packets, enabling data packet movement through the non-blocking fabric.

3. The solid state drive of claim 2, wherein the enabled data packet movement comprises at least one of reading and writing data packets from or to arrays of flash memory.

4. The solid state drive of claim 2, wherein the enabled data packet movement comprises at least one of reading and writing data packets from or to arrays of flash memory, and at least one of receiving and providing data packets to at least one of an embedded central processing unit (eCPU) and volatile memory.

5. The solid state drive of claim 2, further comprising the priority information of each of the data packet being influenced by events external to the flash scheduler.

6. The solid state drive of claim 1, wherein if a scheduled data packet fails, then the flash scheduler provides an indication of the failure to an eCPU connected to at least one port of the non-blocking fabric.

7. The solid state drive of claim 1, wherein at least one port of the non-blocking fabric comprises at least one electrical connection to at least an embedded central processing unit (eCPU).

8. The solid state drive of claim 1, wherein the flash fabric header information comprises a write immediate operation bit that directs the flash scheduler to increase the priority of the data packet.

9. The solid state drive of claim 1, wherein the flash fabric header information comprises a multiple queues operation bit that directs the flash scheduler to put the data packet in multiple queues.

10. The solid state drive of claim 1, wherein the flash fabric header information comprises a no retries operation bit that directs the flash scheduler to avoid retries of operations of the data packet.

11. The solid state drive of claim 1, wherein the flash fabric header information comprises stacked header information, wherein the flash schedule performs multiple operations based on the stacked header information, autonomous from an embedded central processing unit (eCPU) connected to the first port of the non-blocking fabric.

12. The solid state drive of claim 1, further comprising a data scrambler.

13. The solid state drive of claim 1, further comprising a data pattern compression engine, wherein the data pattern compression engine parses data packets, recognizing patterns and compresses the data packets based on the recognized patterns.

14. The solid state drive of claim 1, further comprising a circular buffer for tracking alerts and errors of operation of the flash scheduler.

15. A solid state drive, comprising:
a non-blocking fabric, wherein the non-blocking fabric comprises at least a first port and a second port, wherein the second port comprises a plurality of Input/Outputs (I/Os) that are each connected to a non-volatile memory controller; and
a flash scheduler for scheduling data traffic through the non-block fabric, wherein the data traffic comprises a plurality of data packets, and wherein the flash scheduler extracts flash fabric header information from each of the data packets and schedules the data traffic through the non-blocking fabric based on the extracted flash fabric header information, the flash fabric header information including a write cancel operation bit that directs the flash scheduler to cancel a write of the data packet to an array of flash memory using a bypass queue.

16. A solid state drive, comprising:
a non-blocking fabric, wherein the non-blocking fabric comprises at least a first port and a second port, wherein the second port comprises a plurality of Input/Outputs (I/Os) that are each connected to a non-volatile memory controller; and
a flash scheduler for scheduling data traffic through the non-block fabric, wherein the data traffic comprises a plurality of data packets, and wherein the flash scheduler extracts flash fabric header information from each of the data packets and schedules the data traffic through the non-blocking fabric based on the extracted flash fabric header information, the flash fabric header information including a multiple queues operation bit that directs the flash scheduler to put the data packet in multiple queues.

17. A solid state drive, comprising:
a non-blocking fabric, wherein the non-blocking fabric comprises at least a first port and a second port, wherein the second port comprises a plurality of Input/Outputs (I/Os) that are each connected to a non-volatile memory controller; and
a flash scheduler for scheduling data traffic through the non-block fabric, wherein the data traffic comprises a plurality of data packets, and wherein the flash scheduler extracts flash fabric header information from each of the data packets and schedules the data traffic through the non-blocking fabric based on the extracted flash fabric header information; and retries operation bit that directs the flash scheduler to avoid retries of operations of the data packet.

18. A solid state drive, comprising:
a non-blocking fabric, wherein the non-blocking fabric comprises at least a first port and a second port, wherein the second port comprises a plurality of Input/Outputs (I/Os) that are each connected to a non-volatile memory controller;
a flash scheduler for scheduling data traffic through the non-block fabric, wherein the data traffic comprises a plurality of data packets, and wherein the flash scheduler extracts flash fabric header information from each of the data packets and schedules the data traffic through the non-blocking fabric based on the extracted flash fabric header information, the flash fabric header information including; and a data pattern compression engine, wherein the data pattern compression engine parses data packets, recognizing patterns and compresses the data packets based on the recognized patterns.

19. A solid state drive, comprising:
a non-blocking fabric, wherein the non-blocking fabric comprises a plurality of ports, wherein a subset of the plurality of ports are each connected to a flash controller that is connected to at least one array of flash memory; and
a flash scheduler for scheduling data traffic through the non-blocking fabric, wherein the data traffic comprises a plurality of data packets, wherein the flash scheduler extracts flash fabric header information from each of the data packets and schedules the data traffic through the non-blocking fabric based on the extracted flash fabric header information, the flash fabric header information including a multiple queues operation bit that directs the flash scheduler to put the data packet in multiple queues;
wherein the scheduled data traffic provides transfer of data packets through the non-blocking fabric from at least one array of flash memory to at least one other array of flash memory.

20. The solid state drive of claim 19, further comprising the flash scheduler extracting priority information of each data packet from the flash fabric header information of the data packet, and wherein the flash scheduler schedules high priority data packets before low priority packets, enabling data packet movement through the non-blocking fabric.

21. The solid state drive of claim 20, wherein the enabled data packet movement comprises at least one of reading and writing data packets from or to arrays of flash memory.

22. The solid state drive of claim 20, wherein the enabled data packet movement comprises at least one of reading and writing data packets from or to arrays of flash memory, and at least one of receiving and providing data packets to at least one of an embedded central processing unit (eCPU) and volatile memory.

23. The solid state drive of claim 20, further comprising the priority information of each of the data packet being influenced by events external to the flash scheduler.

24. The solid state drive of claim 19, wherein if a scheduled data packet fails, then the flash scheduler provides an indication of the failure to an eCPU connected to at least one port of the non-blocking fabric.

25. The solid state drive of claim 19, wherein at least one port of the non-blocking fabric comprises at least one electrical connection to at least an embedded central processing unit (eCPU).

26. The solid state drive of claim 19, wherein, the flash fabric header information comprises a write cancel operation bit that directs the flash scheduler to cancel a write of the data packet to an array of flash memory, and using a bypass queue.

27. The solid state drive of claim 19, wherein the flash fabric header information comprises a write immediate operation bit that directs the flash scheduler to increase the priority of the data packet.

28. The solid state drive of claim 19, wherein the flash fabric header information comprises a no retries operation bit that directs the flash scheduler to avoid retries of operations of the data packet.

29. The solid state drive of claim 19, wherein the flash fabric header information comprises stacked header information, wherein the flash schedule performs multiple operations based on the stacked header information, autonomous from an embedded central processing unit (eCPU) connected to the first port of the non-blocking fabric.

30. The solid state drive of claim 19, further comprising a data scrambler.

31. The solid state drive of claim 19, further comprising a data pattern compression engine, wherein the data pattern compression engine parses data packets, recognizing patterns and compresses the data packets based on the recognized patterns.

32. The solid state drive of claim 19, further comprising a circular buffer for tracking alerts and errors of operation of the flash scheduler.

33. A solid state drive, comprising:
a non-blocking fabric, wherein the non-blocking fabric comprises a plurality of ports, wherein a subset of the plurality of ports are each connected to a flash controller that is connected to at least one array of flash memory; and
a flash scheduler for scheduling data traffic through the non-blocking fabric, wherein the data traffic comprises a plurality of data packets, wherein the flash scheduler extracts flash fabric header information from each of the data packets and schedules the data traffic through the non-blocking fabric based on the extracted flash fabric header information, the flash fabric header information including a no retries operation bit that directs the flash scheduler to avoid retries of operations of the data packet,
wherein the scheduled data traffic provides transfer of data packets through the non-blocking fabric from at least one array of flash memory to at least one other array of flash memory.

34. The solid state drive of claim 33, further comprising the flash scheduler extracting priority information of each data packet from the flash fabric header information of the data packet, and wherein the flash scheduler schedules high priority data packets before low priority packets, enabling data packet movement through the non-blocking fabric.

35. The solid state drive of claim 34, wherein the enabled data packet movement comprises at least one of reading and writing data packets from or to arrays of flash memory.

36. The solid state drive of claim 34, wherein the enabled data packet movement comprises at least one of reading and writing data packets from or to arrays of flash memory, and at least one of receiving and providing data packets to at least one of an embedded central processing unit (eCPU) and volatile memory.

37. The solid state drive of claim 34, further comprising the priority information of each of the data packet being influenced by events external to the flash scheduler.

38. The solid state drive of claim 33, wherein if a scheduled data packet fails, then the flash scheduler provides an indication of the failure to an eCPU connected to at least one port of the non-blocking fabric.

39. The solid state drive of claim 33, wherein at least one port of the non-blocking fabric comprises at least one electrical connection to at least an embedded central processing unit (eCPU).

40. The solid state drive of claim 33, wherein the flash fabric header information including a write cancel operation bit that directs the flash scheduler to cancel a write of the data packet to an array of flash memory, and using a bypass queue.

41. The solid state drive of claim 33, wherein the flash fabric header information comprises a write immediate operation bit that directs the flash scheduler to increase the priority of the data packet.

42. The solid state drive of claim 33, wherein the flash fabric header information comprises a multiple queues operation bit that directs the flash scheduler to put the data packet in multiple queues.

43. The solid state drive of claim 33, wherein the flash fabric header information comprises stacked header information, wherein the flash schedule performs multiple operations based on the stacked header information, autonomous from an embedded central processing unit (eCPU) connected to the first port of the non-blocking fabric.

44. The solid state drive of claim 33, further comprising a data scrambler.

45. The solid state drive of claim 33, further comprising a data pattern compression engine, wherein the data pattern compression engine parses data packets, recognizing patterns and compresses the data packets based on the recognized patterns.

46. The solid state drive of claim 33, further comprising a circular buffer for tracking alerts and errors of operation of the flash scheduler.

47. A solid state drive, comprising:
a non-blocking fabric, wherein the non-blocking fabric comprises a plurality of ports, wherein a subset of the plurality of ports are each connected to a flash controller that is connected to at least one array of flash memory;
a flash scheduler for scheduling data traffic through the non-blocking fabric, wherein the data traffic comprises a plurality of data packets, wherein the flash scheduler extracts flash fabric header information from each of the data packets and schedules the data traffic through the non-blocking fabric based on the extracted flash fabric header information; and
a data pattern compression engine operable to parse data packets, recognize patterns and compress the data packets based on the recognized patterns; and
wherein the scheduled data traffic provides transfer of data packets through the non-blocking fabric from at least one array of flash memory to at least one other array of flash memory.

48. The solid state drive of claim 47, further comprising the flash scheduler extracting priority information of each data packet from the flash fabric header information of the data packet, and wherein the flash scheduler schedules high priority data packets before low priority packets, enabling data packet movement through the non-blocking fabric.

49. The solid state drive of claim 48, wherein the enabled data packet movement comprises at least one of reading and writing data packets from or to arrays of flash memory.

50. The solid state drive of claim 48, wherein the enabled data packet movement comprises at least one of reading and writing data packets from or to arrays of flash memory, and at least one of receiving and providing data packets to at least one of an embedded central processing unit (eCPU) and volatile memory.

51. The solid state drive of claim 48, further comprising the priority information of each of the data packet being influenced by events external to the flash scheduler.

52. The solid state drive of claim 47, wherein if a scheduled data packet fails, then the flash scheduler provides an indication of the failure to an eCPU connected to at least one port of the non-blocking fabric.

53. The solid state drive of claim 47, wherein at least one port of the non-blocking fabric comprises at least one electrical connection to at least an embedded central processing unit (eCPU).

54. The solid state drive of claim 47, wherein the flash fabric header information including a write cancel operation bit that directs the flash scheduler to cancel a write of the data packet to an array of flash memory, and using a bypass queue.

55. The solid state drive of claim 47, wherein the flash fabric header information comprises a write immediate operation bit that directs the flash scheduler to increase the priority of the data packet.

56. The solid state drive of claim 47, wherein the flash fabric header information comprises a multiple queues operation bit that directs the flash scheduler to put the data packet in multiple queues.

57. The solid state drive of claim 47, wherein the flash fabric header information comprises a no retries operation bit that directs the flash scheduler to avoid retries of operations of the data packet.

58. The solid state drive of claim 47, wherein the flash fabric header information comprises stacked header information, wherein the flash schedule performs multiple operations based on the stacked header information, autonomous from an embedded central processing unit (eCPU) connected to the first port of the non-blocking fabric.

59. The solid state drive of claim 47, further comprising a data scrambler.

60. The solid state drive of claim 47, further comprising a circular buffer for tracking alerts and errors of operation of the flash scheduler.

* * * * *